United States Patent
Chang et al.

(10) Patent No.: US 7,204,698 B2
(45) Date of Patent: Apr. 17, 2007

(54) CIRCUIT BOARD SOLDER CONNECTION WITH FEATURE TO PREVENT SOLDER BRIDGING

(75) Inventors: Che-Chih Chang, Toufen Township, Miaoli County (TW); Chin-Kun Hsieh, Hsinchu (TW)

(73) Assignee: AU Optronics Corp., Hsinchu (TW)

( * ) Notice: Subject to any disclaimer, the term of this patent is extended or adjusted under 35 U.S.C. 154(b) by 0 days.

(21) Appl. No.: 11/240,244

(22) Filed: Sep. 30, 2005

(65) Prior Publication Data

US 2006/0205245 A1 Sep. 14, 2006

(30) Foreign Application Priority Data

Mar. 14, 2005 (TW) .............................. 94107670 A

(51) Int. Cl.
*H05K 1/00* (2006.01)
(52) U.S. Cl. ........................................ 439/67; 361/749
(58) Field of Classification Search ................ 361/749; 439/67; 174/88 R; 349/150
See application file for complete search history.

(56) References Cited

U.S. PATENT DOCUMENTS

| | | | | |
|---|---|---|---|---|
| 5,418,691 A | * | 5/1995 | Tokura | ........................ 361/803 |
| 5,608,434 A | * | 3/1997 | Wilson et al. | ................. 347/50 |
| 6,045,368 A | * | 4/2000 | Cadenhead et al. | ........... 439/67 |
| 7,023,095 B2 | * | 4/2006 | Lee et al. | .................... 257/774 |
| 7,090,506 B2 | * | 8/2006 | Sung et al. | ................... 439/67 |
| 2006/0006777 A1 | * | 1/2006 | Lo et al. | ..................... 313/113 |

FOREIGN PATENT DOCUMENTS

TW 546995 8/2003

* cited by examiner

*Primary Examiner*—Neil Abrams
(74) *Attorney, Agent, or Firm*—Thomas, Kayden, Horstemeyer & Risley

(57) ABSTRACT

An electronic device comprises a flexible printed circuit board and a circuit board. The flexible printed circuit board comprises two first connection portions and a multifunction opening, wherein the multifunction opening comprises a flow-stopping portion and a first positioning hole, the flow-stopping portion is disposed between the two first connection portions and serves to prevent solder bridging between the connection portions during reflow, and the first positioning hole is formed to be continuous with an end of the flow-stopping portion to form a single elongated opening (120). The circuit board comprises a first positioning aperture corresponding to the first positioning hole, wherein the circuit board is connected to the flexible printed circuit board. A second positioning hole (110) and a second positioning aperture (211) may be formed on the flexible printed circuit board and the circuit board and the multifunction opening 120 may be expanded to include both the positioning holes. A pair of rods (310, 320) may be passed through the positioning holes to establish alignment.

20 Claims, 9 Drawing Sheets

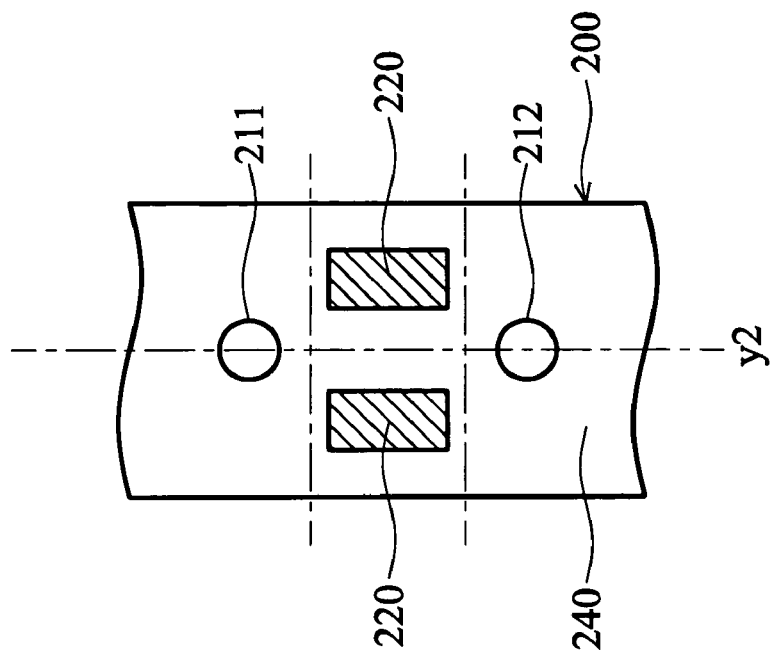
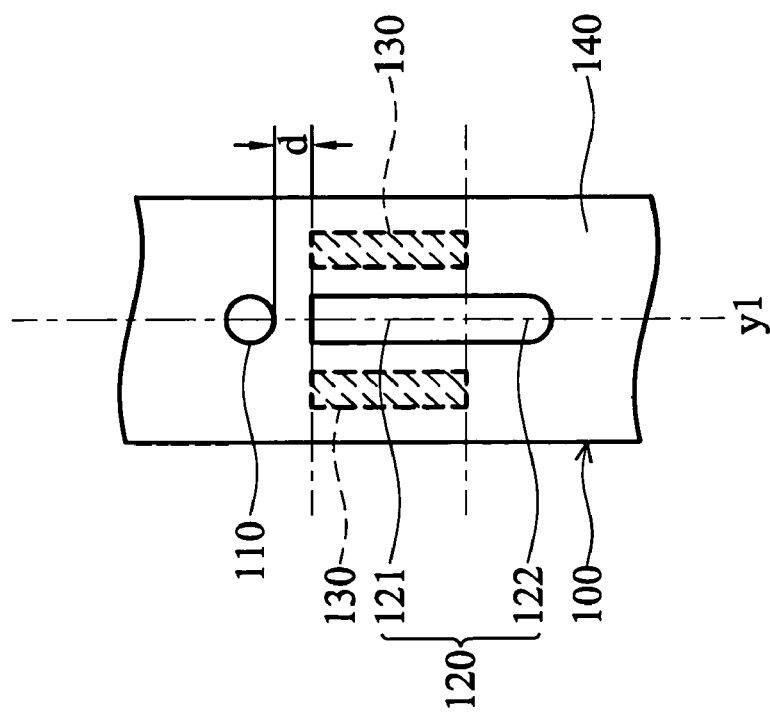
FIG. 4b
FIG. 4a

CIRCUIT BOARD SOLDER CONNECTION WITH FEATURE TO PREVENT SOLDER BRIDGING

BACKGROUND

The invention relates to an electronic device, and more particularly to an easily assembled electronic device.

FIGS. 1a and 1b show flexible printed circuit boards 10 and 20 utilized in a conventional flat panel display. As shown in FIG. 1a, flexible printed circuit board 10 is coupled to panel 1, and comprises a positioning hole 11, a flow-stopping opening 12 and connection portions 13. As shown in FIG. 1b, flexible printed circuit board 20 is partially disposed in backlight module 2, and comprises a positioning hole 21, light emitting diodes (LEDs) 22 and connection portions 23.

With reference to FIG. 2a, during assembly of a conventional flat panel display, positioning hole 11 overlaps positioning hole 21, and connection portions 13 overlap connection portions 23. FIG. 2b shows the detailed structure of portion A of FIG. 2a, wherein when the flexible printed circuit board 10 is connected to flexible printed circuit board 20, a positioning structure 31 passes through positioning hole 11 and positioning hole 21 to prevent misalignment between connection portions 13 and connection portions 23. Next, connection portions 13 are soldered to connection portions 23 by hot bar soldering, utilizing solder 30 and heater 33. Thus, flexible printed circuit board 10 is connected to flexible printed circuit board 20.

With reference to FIG. 3a, however, flexible printed circuit boards 10 and 20 are positioned by positioning structure 31 only, they may pivot and be misaligned in the direction shown by the arrow in FIG. 3a, causing the soldering to fail.

FIG. 3b shows flexible printed circuit boards 10 and 20 of another conventional flat panel display, wherein flexible printed circuit board 10 further comprises a positioning hole 14, and flexible printed circuit board 20 further comprises a positioning hole 24 allowing the positioning structure 32 to pass therethrough. The misalignment between flexible printed circuit boards 10 and 20 is therefore prevented. Out of tolerance positioning holes 14 and 24, however, become misaligned preventing positioning structure 32 from quickly passing therethrough, increasing soldering time, and decreasing manufacturing speed.

SUMMARY

It is an object of the present invention to provide an electronic device and a flat panel display utilizing the same. An exemplary embodiment of an electronic device comprises a flexible printed circuit board and a circuit board connected therewith. The flexible printed circuit board comprises two first connection portions, a multifunction opening including a flow-stopping portion and a first positioning hole and a second positioning hole. The two first connection portions are longitudinal and substantially parallel to each other. The multifunction opening is longitudinal. The flow-stopping portion is disposed between the two first connection portions. The length of the flow-stopping portion is equal to the length of the two first connection portions. The first positioning hole is connected to a first end of the flow-stopping portion. The second positioning hole is formed on an extending line of a major axis of the multifunction opening and is separated by a certain distance from a second end of the flow-stopping portion. The circuit board comprises a first positioning aperture and a second positioning aperture. The first positioning aperture and a second positioning aperture are corresponding to the first positioning hole and the second positioning hole such that the circuit board is connected to the flexible printed circuit board.

In a preferred embodiment, the second positioning hole is connected to the second end of the flow-stopping portion.

An exemplary embodiment of a flat panel display comprises a panel and an electronic device. The electronic device is connected to the panel, and comprises a flexible printed circuit board and a circuit board. The flexible printed circuit board comprises two first connection portions and a multifunction opening. The multifunction opening comprises a flow-stopping portion and a first positioning hole. The flow-stopping portion is disposed between the two first connection portions, and the first positioning hole is connected to an end of the flow-stopping portion. The circuit board comprises a first positioning aperture corresponding to the first positioning hole, wherein the circuit board is connected to the flexible printed circuit board.

The invention prevents misalignment between the first connection portions and the second connection portions, thus increasing manufacturing speed and reliability.

BRIEF DESCRIPTION OF THE DRAWINGS

The invention will be more fully understood from the following detailed description and the accompanying drawings, given by the way of illustration only and thus not intended to limit the disclosure.

FIG. 2b depicts the detailed structure of portion A of FIG. 2a;

FIG. 4a depicts a flexible printed circuit board of a first embodiment of the invention;

FIG. 4b depicts a circuit board of a first embodiment of the invention;

DETAILED DESCRIPTION

First Embodiment

Figure 1A:
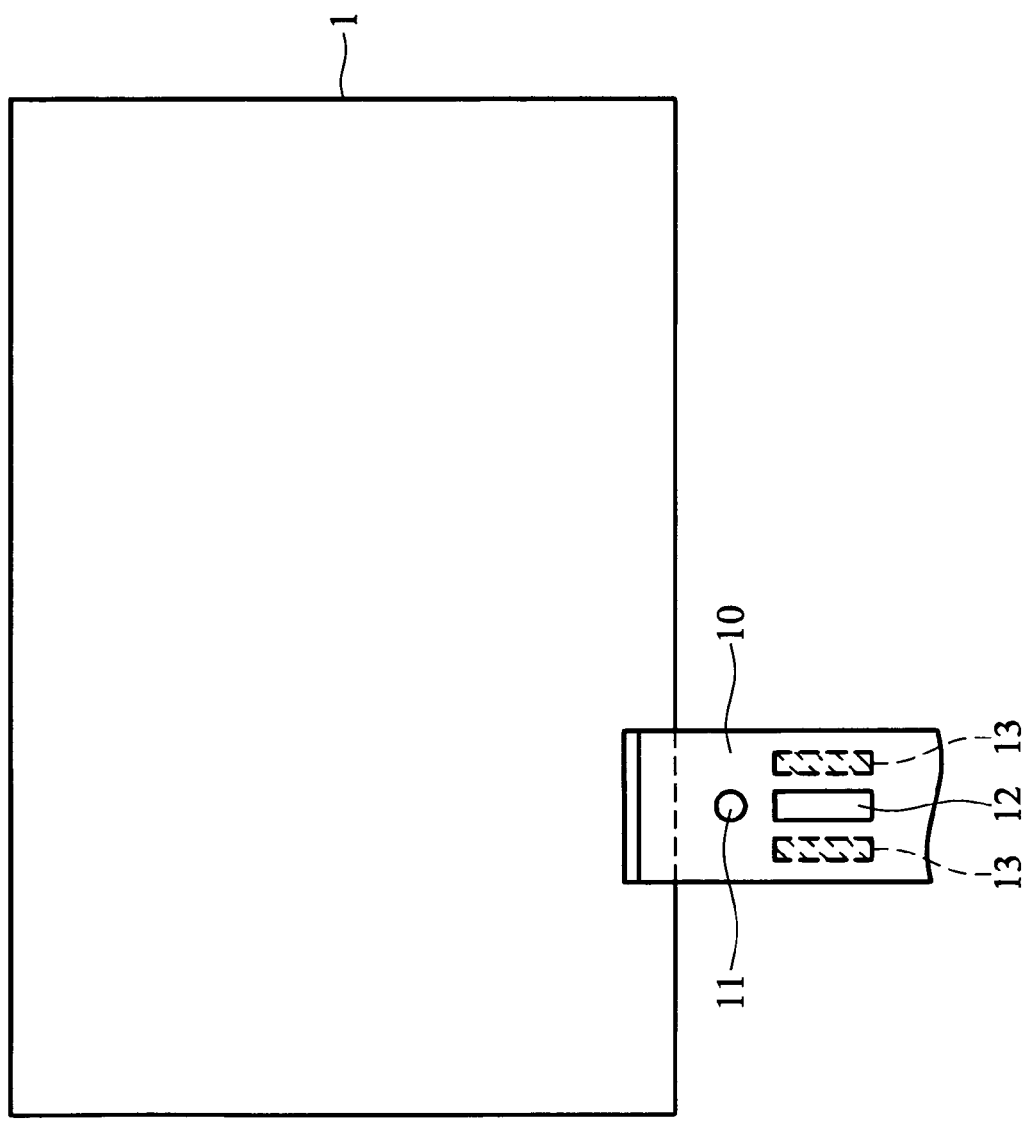
FIGS. 1a and 1b depict conventional flexible printed circuit boards.
Figure 1B:
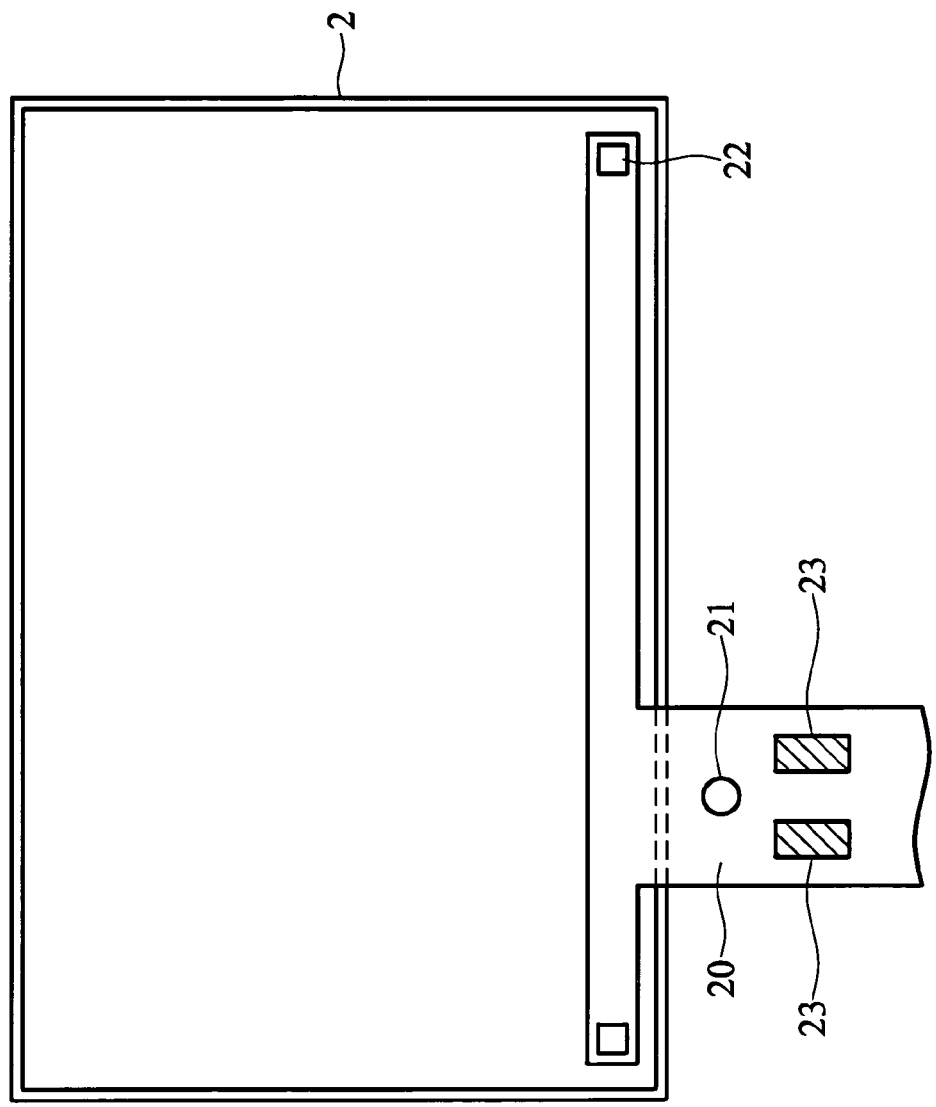
Figure 2A:
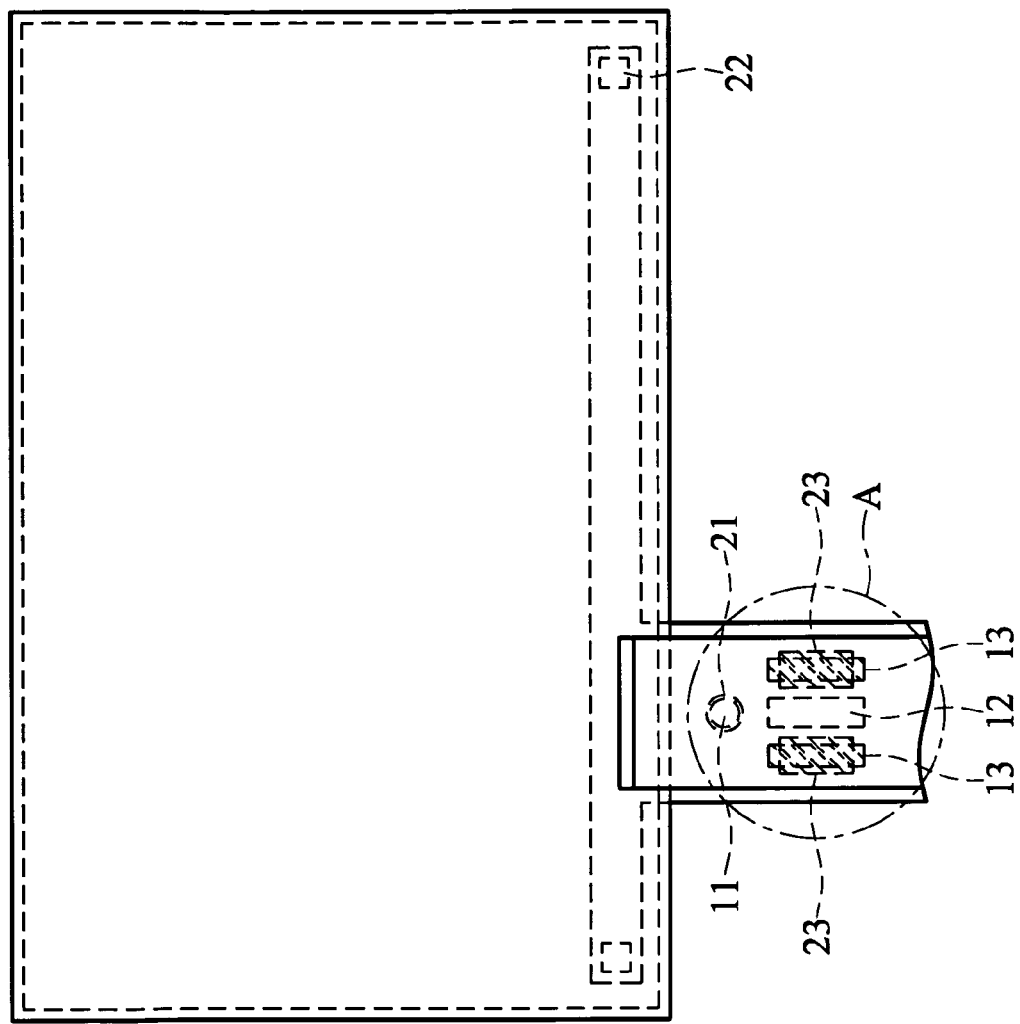
FIG. 2a depicts overlapping conventional flexible printed circuit boards.
Figure 2B:
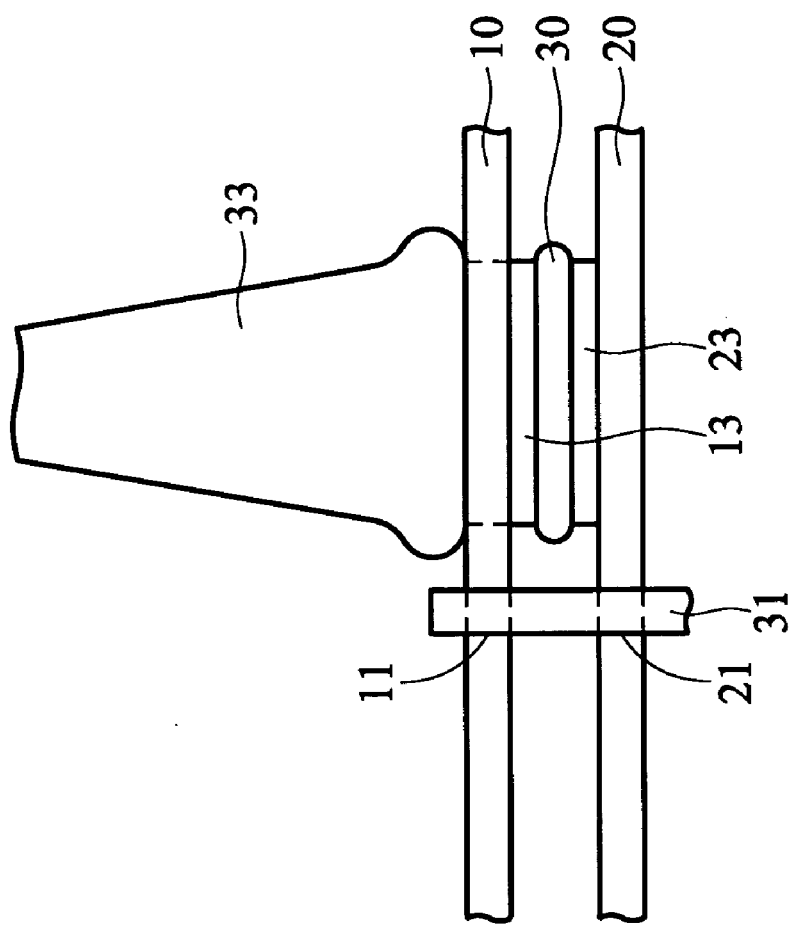
Figure 3B:
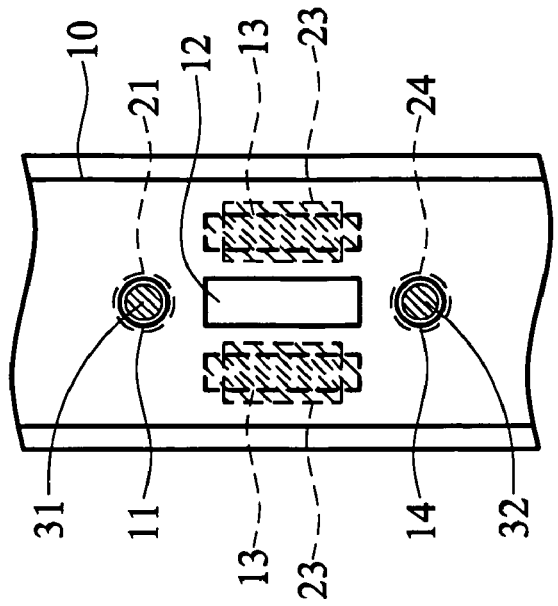
FIG. 3b depicts other conventional flexible printed circuit boards.
Figure 3A:
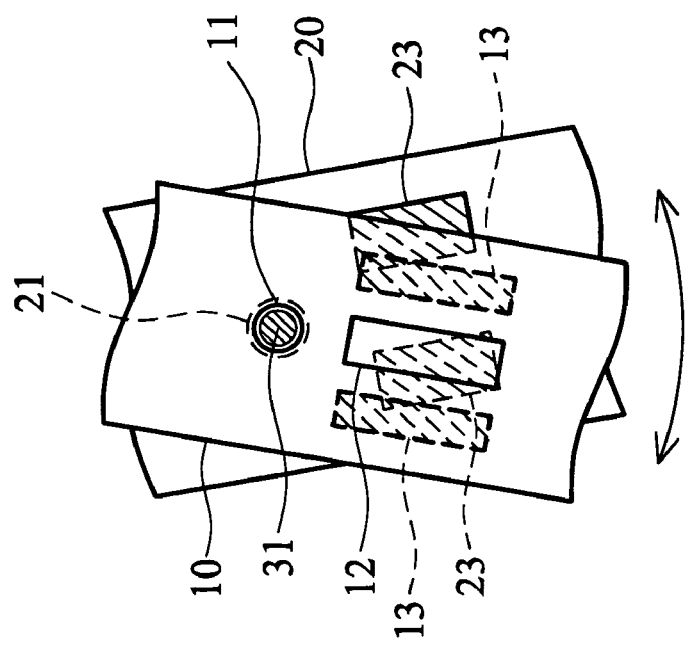
FIG. 3a depicts conventional flexible printed circuit boards rotating relative to each other.

FIG. 4a shows a flexible printed circuit board 100 of a first embodiment of the invention, which comprises a substrate 140, two first connection portions 130, a multifunction opening 120 and a second positioning hole 110. The second positioning hole 110, the multifunction opening 120 and the first connection portions 130 are formed on the substrate 140. The first connection portions 130 are longitudinal metal sheet, disposed in parallel and horizontally aligned. The multifunction opening 120 is longitudinal, and comprises a flow-stopping portion 121 and a first positioning hole 122. The flow-stopping portion 121 is formed between the first connection portions 130. The length of the flow-stopping portion 121 is equal to the length of the first connection portions 130. The first positioning hole 122 is connected to a first end of the flow-stopping portion 121. The second positioning hole 110 is an opening formed on an extending line y1 of the major axis of the multifunction opening 120, and is separated by a distance d from a second end of the flow-stopping portion 121.

With reference to FIG. 4b, the flexible printed circuit board 100 mentioned above is coupled to a circuit board 200. The circuit board 200 comprises a substrate 240, two second connection portions 220, a first positioning aperture 212 and a second positioning aperture 211. The second connection portions 220, the first positioning aperture 212 and the second positioning aperture 211 are formed on the substrate 240. The second connection portions 220 are longitudinal metal sheet and parallel to each other. The first positioning aperture 212 and the second positioning aperture 211 are formed on an extending line y2. The extending line y2 is formed between the second connection portions 220, and extends along the major axes of the second connection portions 220.

Figure 5B:
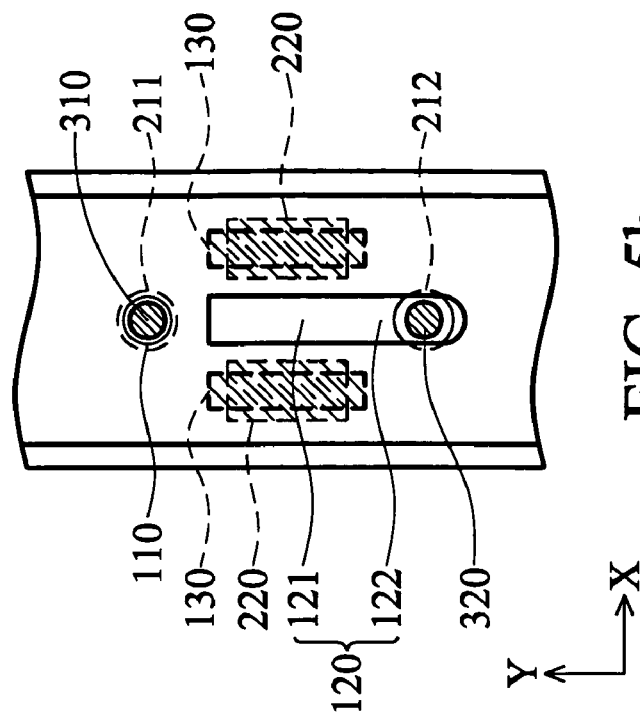
FIG. 5b depicts the flexible printed circuit board and the circuit board positioned by positioning structures.
Figure 5A:
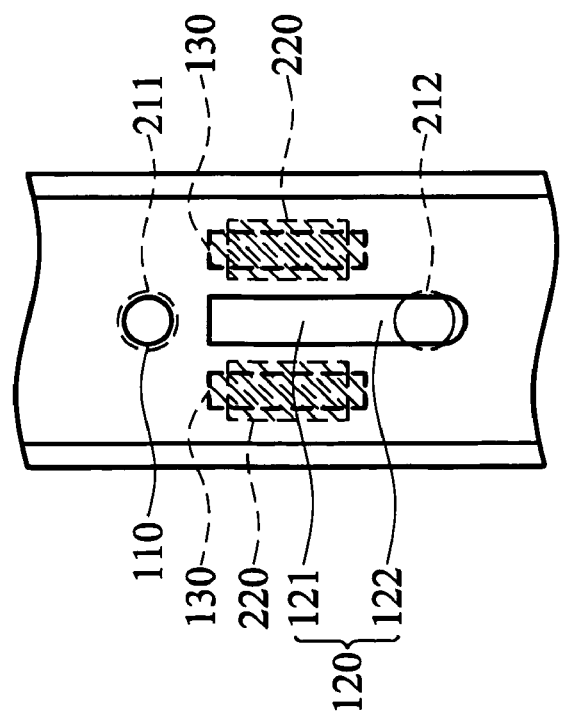
FIG. 5a depicts the flexible printed circuit board overlapping the circuit board according to the first embodiment of the invention.

As shown in FIG. 5a, the first positioning hole 122 corresponds to the first positioning aperture 212, the second positioning hole 110 corresponds to the second positioning aperture 211, and the first connection portions 130 correspond to the second connection portions 220. As shown in FIG. 5b, during soldering, a first positioning structure 320 passes through the first positioning hole 122 and the first positioning aperture 212, and a second positioning structure 310 passes through the second positioning hole 110 and the second positioning aperture 211. The first connection portions 130 and the second connection portions 220 are then soldered and coupled by hot bar soldering. The flow-stopping portion 121 enables solder to flow therethrough, and prevents short between the first connection portions 130 and the second connection portions 220. The first positioning structure 320 and the second positioning structure 310 may be cylinders.

With reference to FIG. 5b, in the first embodiment of the invention, the first positioning structure 320 and the second positioning structure 310 prevent the flexible printed circuit board 100 from moving in x, y directions and from rotating relative to the circuit board 200. The first positioning hole 122 is connected to the flow-stopping portion 121, allowing slight manufacturing inaccuracies, enabling the first positioning structure 320 to quickly pass therethrough, and increases manufacturing speed.

The flexible printed circuit board 100 and the circuit board 200 are selectively coupled to a panel or other electronic device. Additionally, light sources (such as LEDs) or other electronic elements are disposed on the flexible printed circuit board 100 or the circuit board 200.

The circuit board 200 is a printed circuit board, a flexible printed circuit board or a carrier utilized in tape-carrier package (TCP).

Second Embodiment

Figure 6B:
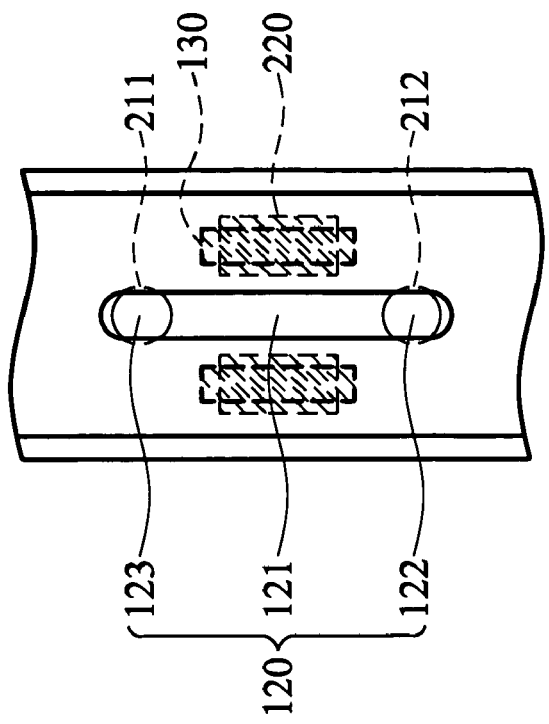
FIG. 6b depicts the flexible printed circuit board overlapping the circuit board according to the second embodiment of the invention.
Figure 6A:
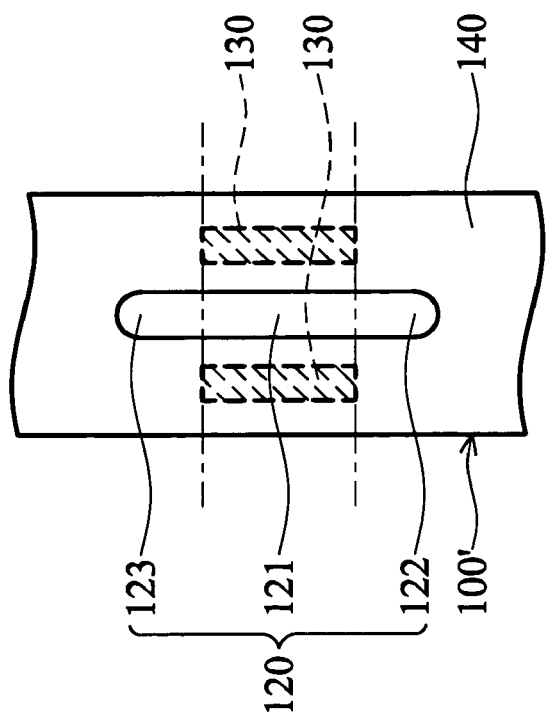
FIG. 6a depicts a flexible printed circuit board of a second embodiment of the invention.

FIG. 6a shows a second embodiment of the invention. In the second embodiment, the multifunction opening 120 of the flexible printed circuit board 100 further comprises a second positioning hole 123 connected to the second end of the flow-stopping portion 121. As shown in FIG. 6b, the second positioning hole 123 replaces the second positioning hole 110 of the first embodiment, and corresponds to the second positioning aperture 211 of the circuit board 200.

Figure 6C:
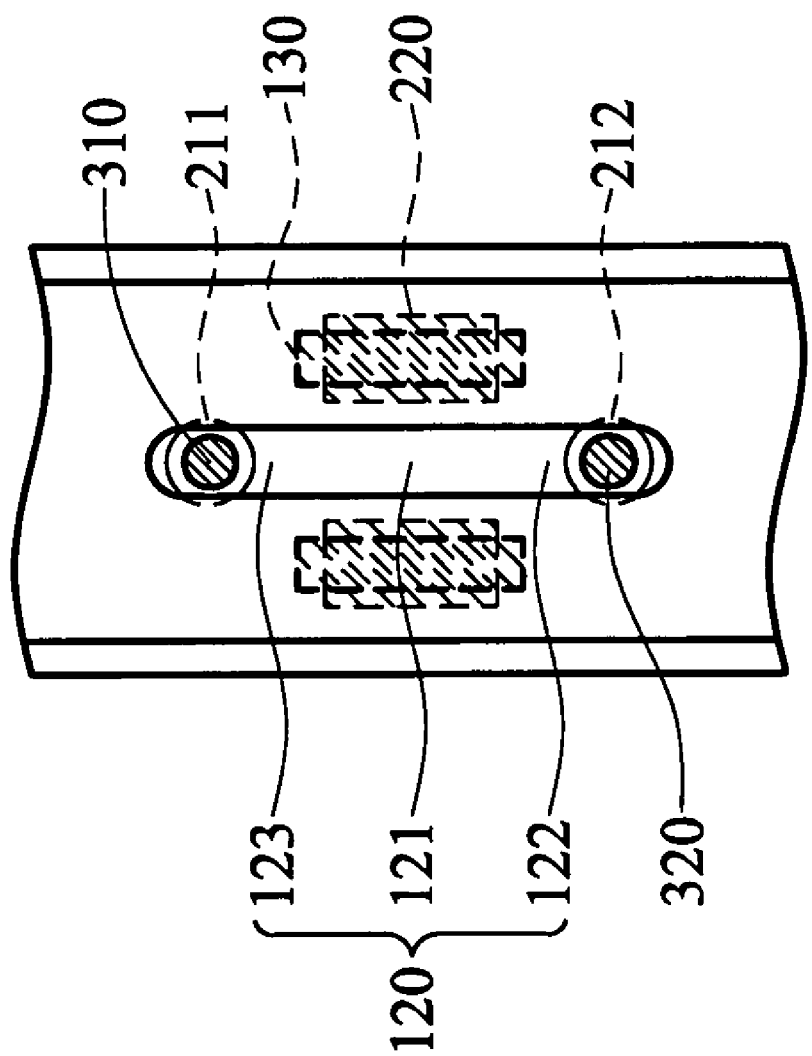
FIG. 6c depicts the flexible printed circuit board and the circuit board positioned by positioning structures in the second embodiment.

As shown in FIG. 6c, during soldering, a first positioning structure 320 passes through the first positioning hole 122 and the first positioning aperture 212, and a second positioning structure 310 passes through the second positioning hole 123 and the second positioning aperture 211. Then, the first connection portions 130 and the second connection portions 220 are soldered and coupled by hot bar soldering.

In the second embodiment of the invention, the first positioning hole 122 and the second positioning hole 123 are connected to the flow-stopping portion 121, permitting more manufacturing tolerances, enabling the first positioning structure 320 and the second positioning structure 310 to quickly pass therethrough, and increase manufacturing speed.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation to encompass all such modifications and similar arrangements.

What is claimed is:

1. An electronic device, comprising:
    a flexible printed circuit board comprising two first connection portions and a multifunction opening, wherein the multifunction opening comprises a flow-stopping portion and a first positioning hole, the flow-stopping portion is disposed between the two first connection portions, and the first positioning hole is connected to an end of the flow-stopping portion; and
    a circuit board comprising a first positioning aperture corresponding to the first positioning hole, wherein the circuit board is connected to the flexible printed circuit board.

2. The electronic device as claimed in claim 1, wherein the circuit board comprises two second connection portions soldered to the two first connection portions.

3. The electronic device as claimed in claim 1, wherein the flexible printed circuit board further comprises a second positioning hole formed on the other end of the flow-stopping portion corresponding to a second positioning aperture formed on the circuit board.

4. The electronic device as claimed in claim 3, wherein the second positioning hole is connected to the flow-stopping portion.

5. The electronic device as claimed in claim 1, wherein the multifunction opening is longitudinal.

6. The electronic device as claimed in claim 1, wherein the two first connection portions are longitudinal and substantially parallel to each other.

7. The electronic device as claimed in claim 6, wherein the two first connection portions are aligned along the minor axis thereof.

8. The electronic device as claimed in claim 6, wherein the length of the flow-stopping portion is substantially equal to the length of the two first connection portions.

9. The electronic device as claimed in claim 1, further comprising a light source disposed on the flexible printed circuit board.

10. A flat panel display, comprising:
    a panel; and an electronic device, connected to the panel, comprising:
a flexible printed circuit board comprising two first connection portions and a multifunction opening, wherein the multifunction opening comprises a flow-stopping portion and a first positioning hole the flow-stopping portion is disposed between the two first connection portions, and the first positioning hole is connected to an end of the flow-stopping portion; and
a circuit board comprising a first positioning aperture corresponding to the first positioning hole, wherein the circuit board is connected to the flexible printed circuit board.

11. The flat panel display as claimed in claim 10, wherein the panel is connected to the circuit board.

12. The flat panel display as claimed in claim 10, wherein the panel is connected to the flexible printed circuit board.

13. The flat panel display as claimed in claim 10, further comprising a light source disposed on the electronic device.

14. The flat panel display as claimed in claim 10, wherein the circuit board comprises two second connection portions soldered to the two first connection portions.

15. The flat panel display as claimed in claim 10, wherein the flexible printed circuit board further comprises a second positioning hole formed on the other end of the flow-stopping portion corresponding to a second positioning aperture formed on the circuit board.

16. The flat panel display as claimed in claim 15, wherein the second positioning hole is connected to the flow-stopping portion.

17. The flat panel display as claimed in claim 10, wherein the multifunction opening is longitudinal.

18. The flat panel display as claimed in claim 10, wherein the two first connection portions are longitudinal and substantially parallel to each other.

19. The flat panel display as claimed in claim 18, wherein the two first connection portions are aligned along the minor axis thereof.

20. The flat panel display as claimed in claim 18, wherein the length of the flow-stopping portion is substantially equal to the length of the two first connection portions.

* * * * *